United States Patent [19]

Matsumoto et al.

[11] Patent Number: 4,752,932
[45] Date of Patent: Jun. 21, 1988

[54] BRANCHING OPTICAL WAVEGUIDE FOR AN INDEX-GUIDED SEMICONDUCTOR LASER DEVICE

[75] Inventors: Mitsuhiro Matsumoto; Sadayoshi Matsui; Mototaka Taneya, all of Tenri, Japan

[73] Assignee: Sharp Kabushiki Kaisha, Osaka, Japan

[21] Appl. No.: 791,122

[22] Filed: Oct. 24, 1985

[30] Foreign Application Priority Data

Oct. 25, 1984 [JP] Japan ................................ 59-225429

[51] Int. Cl.⁴ ............................................... H01S 3/19
[52] U.S. Cl. ......................................... 372/45; 372/50
[58] Field of Search ...................... 372/44, 45, 46, 50, 372/48

[56] References Cited

U.S. PATENT DOCUMENTS

Re. 31,806  1/1985  Scifres et al. .......................... 372/50
4,185,256  1/1980  Scifres et al. .......................... 372/46
4,674,827  6/1987  Izutsu et al. ....................... 350/96.15

FOREIGN PATENT DOCUMENTS 0115390  1/1984  European Pat. Off. .

Primary Examiner—James W. Davie
Attorney, Agent, or Firm—Birch, Stewart, Kolasch & Birch

[57] ABSTRACT

A semiconductor laser device uses an optical waveguide which is in a single mode in the center portion thereof and is in a branching mode at each of both end portions thereof to form two branch waveguides which are positioned symmetrically with respect to the waveguiding direction of the laser light and which are parallel to each other near the facets, thereby attaining a 0°-phase shift between light waves propagated in the two branch waveguides and resulting in laser lights with a 0°-phase shift therebetween.

6 Claims, 2 Drawing Sheets

BRANCHING OPTICAL WAVEGUIDE FOR AN INDEX-GUIDED SEMICONDUCTOR LASER DEVICE

BACKGROUND OF THE INVENTION

1. Field of the invention:

This invention relates to a semiconductor laser device which oscillates to develop high output power laser lights with a 0°-phase shift therebetween and more particularly to the optical waveguide producing semiconductor element utilized therein.

2. Description of the prior art:

Semiconductor laser devices having a single lasing filament structure can only produce about 50 mW of light energy at their best. In order to produce high output power, semiconductor laser devices have been studied, in which a plurality of lasing filaments are disposed in a parallel manner on the same substrate to achieve an optical phase coupling between the adjacent lasing filaments.

Provided that two lasing filaments are parallelly disposed on the same substrate, there will be three relationships between the laser oscillation of adjacent filaments: The first is that the two laser lights obtain attain a 0°-phase shift therebetween, the second is that the optical phase shift between the two laser lights is 180°. And the third is a mixture of the above-mentioned cases. A far-field pattern in the first case, as shown in FIG. 3(A), has a single peak so that the two laser lights can be concentrated into a spot by means of optical lenses. However, far-field patterns in the second and third cases, as shown in FIGS. 3(B) and 3(C), respectively, have plural peaks so that the two laser lights cannot be concentrated onto a single spot by any optical lens. Thus, semiconductor laser array devices, including gain-guided semiconductor laser array devices and index-guided semiconductor laser array devices in which a plurality of lasing filaments are disposed in a parallel manner to achieve an optical phase coupling between the adjacent filaments, have been proposed.

However, in gain-guided semiconductor laser array devices, the electric field in the center area between the adjacent lasing filaments is zero, so that the laser lights must be produced with a 180°-phase shift therebetween, resulting in a far-field pattern having plural peaks. On the other hand, in index-guided semiconductor laser array devices, the electric field between the adjacent lasing filaments is not necessarily zero, so that laser lights with a 0°-phase shift therebetween is not always attained. It can be said that semiconductor laser array devices attaining a 0°-phase shift between the adjacent filaments cannot be easily fabricated by the simple disposition of plural lasing filaments in a parallel manner.

SUMMARY OF THE INVENTION

The semiconductor laser device of this invention which overcomes the above-discussed and numerous other disadvantages and deficiencies of the prior art, comprises an optical waveguide which is in a single mode in the center portion thereof and is in a branching mode at each of both end portions thereof to form two branch waveguides which are positioned symmetrically with respect to the waveguiding direction of the laser light and which are parallel to each other near the facets, thereby attaining a 0°-phase shift between light waves propagated in the two branch waveguides and resulting in laser lights with a 0°-phase shift therebetween.

The optical waveguide is, in a preferred embodiment, symmetrical with respect to the center line which is vertical to the propagation direction of a laser light.

Thus, the invention described herein makes possible the object of providing an index-guided semiconductor laser array device having two laser operation areas, which attains a 0°-phase shift between the two laser operation areas, resulting in high output power laser light with a radiation pattern of a single peak.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
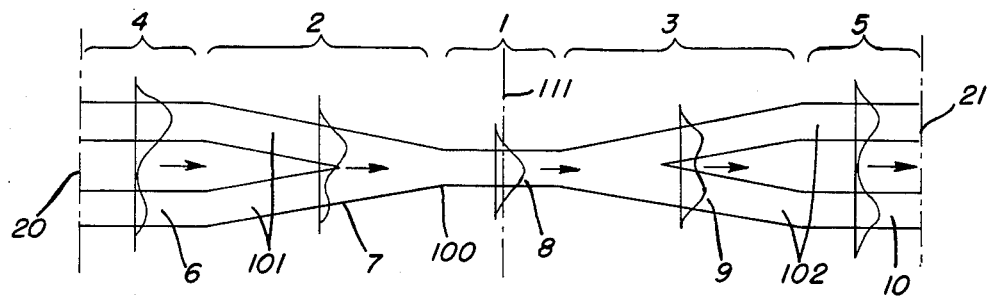
FIG. 1 is a diagram showing the function of the optical waveguide of a semiconductor laser array device having two laser operation areas of this invention and showing the transverse distribution of the electric field of laser lights propagated in the optical waveguide.

FIG. 1 shows a plane view of the optical waveguide 100 of an index-guided semiconductor laser array device having two laser operation areas which attain laser oscillation with a 0°-phase shift therebetween. The optical waveguide 100 is in a single mode in the center portion 1 thereof and in a branching mode at each of both end portions 2 and 3 thereof to form two branch waveguides 101, 101 and 102, 102, repsectively, which are positioned symmetrically with respect to the waveguiding direction of the laser light and which are parallel to each other in the portions 4 and 5, respectively, near the facets 20 and 21. Curves in FIG. 1 indicate the transverse distribution of an electric field with regard to the propagated lights at the specific portions in the optical waveguide 100. The basic operation of the semiconductor laser array device of this invention is as follows: Lights 6, which are propagated with a certain degree-phase shift therebetween in the two parallel branch waveguides 101 and 101 of the portion 4 near the facet 20 in the direction from one facet 20 to the other facet 21, are gradually synthesized to minimize loss in the branched portion 2, resulting in a light 7 having the electrical field distribution shown in FIG. 1. A portion of the light 7 in a high-order mode is cut off in the center portion 1 in the single mode of the optical waveguide 100, resulting in a single light 8 in the fundamental mode which is propagated successively. The light 8 gradually branches in the branched portion 3 of the optical waveguide 100 to form lights 9 having a 0°-phase shift therebetween. In the two parallel branch waveguides of the portion 5 near the facet 21, lights 10 are propagated with a 0°-phase shift therebetween to the facet 21. On the contrary, light waves, which are propagated with a certain degree-phase shift therebetween in the two parallel branch waveguides 102 and 102 of the portion 5 in the direction from the facet 21 to the facet 20, proceed in the same manner as mentioned above in the case where the optical waveguide 100 is symmetrical with respect to the center line 111 which is vertical to the propagation direction of lights, resulting in lights with a 0°-phase shift therebetween in the other two parallel branch waveguides near the facet 20.

Thus, the semiconductor laser array device of this invention attains a 0°-phase shift between laser lights propagated in the two laser operation areas of the above-mentioned waveguide structure, and laser lights emitted from the device attain a far-field pattern having a single peak.

Although the laser light has a high density in the single mode portion 1 of the optical waveguide 100, output power in which facet-breakdown usually occurs is greater in the single mode portion 1 than in the branched portions near the facets 20 and 21 by about one order of magnitude, so that the device can produce high output power laser lights without degradation.

(EXAMPLE)

Figure 2:
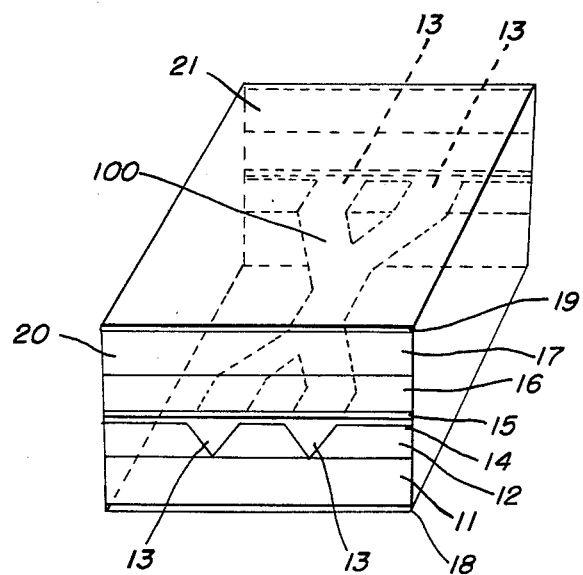
FIG. 2 is a perspective view of the semiconductor laser array device shown in FIG. 1.

FIG. 2 shows an index-guided VSIS (V-channeled substrate inner stripe) semiconductor laser device of this invention, which is fabricated as follows: On a Zn-doped p-GaAs substrate ($p=1\times10^{19}$ cm$^{-3}$) 11, a Te-doped n-GaAs current blocking layer ($n=3\times10^{18}$ cm$^{-3}$) 12 is grown by a liquid phase epitaxial growth technique using a sliding boat known to those skilled in the art. Then, V-channels 13 are formed into the above-mentioned pattern of the optical waveguide on the current blocking layer 12 in a manner to reach the substrate 11 by photolithography and an etching technique. The portion of each of the channels 13 positioned in the substrate 11 functions as an electric current path. Then, on the current blocking layer 12 containing the channels 13, a p-$Ga_{1-x}Al_xAs$ cladding layer 14, a p- (or n-) $Ga_{1-y}Al_yAs$ active layer 15 and an n-$Ga_{1-x}Al_xAs$ cladding layer 16 are successively grown by the same liquid phase epitaxial growth technique as mentioned above to form a multiple-layered crystal for laser oscillation of a double heterostructure type. The relationship between the composition ratios x and y is preferably set to be approximately $x \geq y+0.2$. An n$^+$-GaAs cap layer 17 is then disposed on the n-cladding layer 16. A p-side electrode 18 and an n-side electrode 19 are on the back face of the substrate 11 and the upper face of the cap layer 17, respectively, by a vacuum-evaporating method, etc. Facets are then formed by a cleavage, resulting in a Fabry-P'erot resonator for laser oscillation.

Since the optical waveguide in the resulting semiconductor laser device is formed in the portion of the active layer 15 corresponding to the channels 13, it is in a single mode in the center portion inside the resonator and in a branching mode at each of both end portions to form two branch waveguides which are parallel to each other near the facets.

Figure 3A:
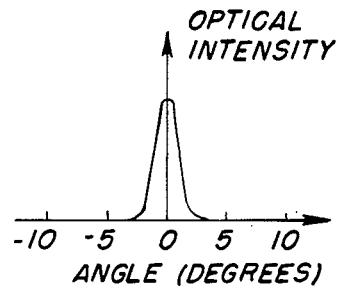
FIG. 3(A) is a diagram showing the far-field pattern attained by the semiconductor laser array device shown in FIG. 2.
Figure 3B:
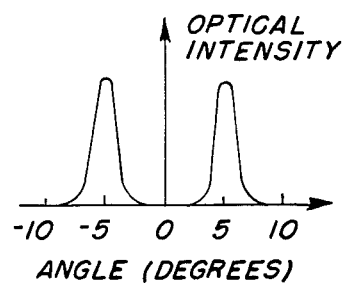
FIGS. 3(B) and 3(C), respectively, are diagrams showing the far-field patterns attained by conventional semiconductor laser array devices having two laser operation areas.
Figure 3C:
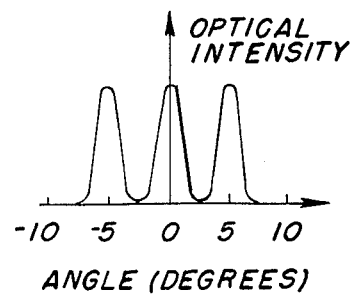

When electric current is injected into the device through the p-side electrode 18 and the n-side electrode 19, it flows into the active layer 15 through the channels 13, on which the current blocking layer 12 is not formed, since the polarity of the current blocking layer 12 is different from that of the substrate 11 thereby blocking a current flow from the substrate 11 to the current blocking layer 12. Thus, the portion of the active layer 15 which correpsonds to the channels 13 functions as an index-guided waveguide to attain laser oscillation. The high-order mode portion of the laser light is cut off in the center portion of the single mode of the waveguide while it is propagated in the waveguide, resulting in two lights in the fundamental mode which are then irradiated with a 0°-phase shift therebetween from the portion of the facets corresponding to the channels 13. The far-field pattern of the emitted lights exhibits a steep single peak as shown in FIG. 3(A), which indicates that laser lights are oscillated with a 0°-phase shift therebetween from the two laser operation area.

As described above, the semiconductor laser device attains laser oscillation with a 0°-phase shift between the two laser operation area, resulting in high output power laser lights of a far-field pattern having a single peak.

The semiconductor laser device of this invention is not limited to index-guided VSIS semiconductor laser devices, but is applicable to other types of index-guided semiconductor laser devices. As crystal materials, InpInGaAsP systems, etc., can be applied instead of the GaAs-GaAlAs systems.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser device wherein the improvement comprises:
   an optical waveguide which is in a single mode in the center portion thereof and is in a branching mode at each of both end portions thereof to form two branch waveguides which are postioned symmetrically with respect to the waveguiding direction of the laser light and which are parallel to each other near the facets, thereby attaining a 0°-phase shift between light waves propagated in the two branch waveguides and resulting in laser lights with a 0°-phase shift therebetween.

2. A semiconductor laser device according to claim 1, wherein said optical waveguide is symmetrical with respect to a center line of a waveguiding plane and which is perpendicular to the propagation direction of a laser light.

3. A semiconductor laser device wherein the improvement comprises:
   an optical waveguide having a center portion and first and second opposing end portions, each said end portion terminating at a facet, the center portion of said waveguide being shaped to provide a single mode therein, each said end portion branching to provide a branching mode and terminating adjacent a said facet in two parallel branch waveguides symmetrically disposed with respect to a waveguiding direction of the laser light, said waveguide attaining a 0°-phase shift between light waves propagated in two branch waveguides to develop laser light waves with a 0°-phase shift therebetween.

4. A semiconductor laser device according to claim 3, wherein said optical waveguide is symmetrical with respect to a center line of a waveguiding plane and which is perpendicular to the propagation direction of a laser light.

5. An optical waveguide for a semiconductor laser device comprising:
- a center portion shaped to provide a single mode therein;
- first and second opposing end portions, each said end portion terminating at a facet, each said end portion branching to provide a branching mode and terminating adjacent a said facet in two parallel branch waveguides symmetrically disposed with respect to a waveguiding direction of the laser light, said waveguide attaining a 0°-phase shift between light waves propagated in two branch waveguides to develop laser light waves with a 0°-phase shift therebetween.

6. The optical waveguide of claim 5, wherein said optical waveguide is symmetrical with respect to a center line of a waveguiding plane and which is perpendicular to the propagation direction of a laser light.

* * * * *